United States Patent [19]

Smith et al.

[11] Patent Number: 5,068,580
[45] Date of Patent: Nov. 26, 1991

[54] ELECTRICAL BEAM SWITCH

[75] Inventors: Lawrence N. Smith, Austin; Ollie C. Woodard, Sr., Buda; Dennis J. Herrell, Austin, all of Tex.

[73] Assignee: Microelectronics and Computer Technology Corporation, Austin, Tex.

[21] Appl. No.: 359,019

[22] Filed: May 30, 1989

[51] Int. Cl.$^5$ .................... G09G 1/04; H01J 29/70; H04Q 1/28
[52] U.S. Cl. .................. 315/366; 340/825.79; 340/825.81; 313/422
[58] Field of Search .............. 315/366; 313/422; 340/825.94, 825.81, 825.79, 825.82

[56] References Cited

U.S. PATENT DOCUMENTS

| | | | |
|---|---|---|---|
| 3,617,790 | 11/1971 | Hills | 315/368 |
| 3,836,795 | 9/1974 | Halasz et al. | 315/368 |
| 3,935,500 | 1/1976 | Oess et al. | 313/422 |
| 4,310,843 | 1/1982 | Yoder | 342/372 |
| 4,333,035 | 6/1982 | Parker et al. | 313/422 |
| 4,618,801 | 10/1986 | Kakino | 313/422 |
| 4,953,155 | 8/1990 | Tangonen et al. | 340/825.81 |

*Primary Examiner*—Gregory C. Issing
*Attorney, Agent, or Firm*—Fulbright & Jaworski

[57] ABSTRACT

An electrical beam switch for interconnection between a plurality of inputs and outputs and includes a two-dimensional array of electrically charged particle emitters and an array of detectors facing the emitter array for receiving charged particles from various of the emitters. X and y electrical deflectors are positioned adjacent each of the emitters for directing the charged particles from each of the emitters to a selected one or more of the detectors. A screen lens may be positioned adjacent the array of detectors for focusing the directed beams on to the selected detector.

12 Claims, 4 Drawing Sheets

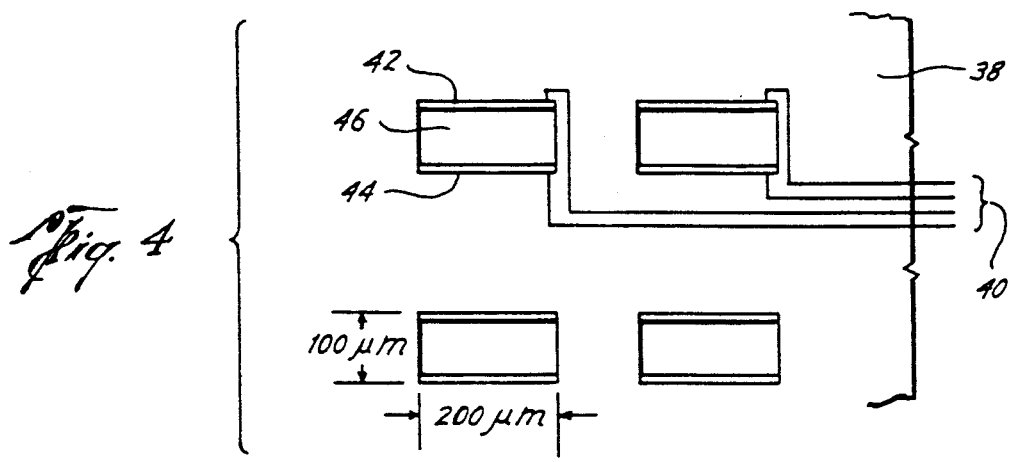
Fig. 4
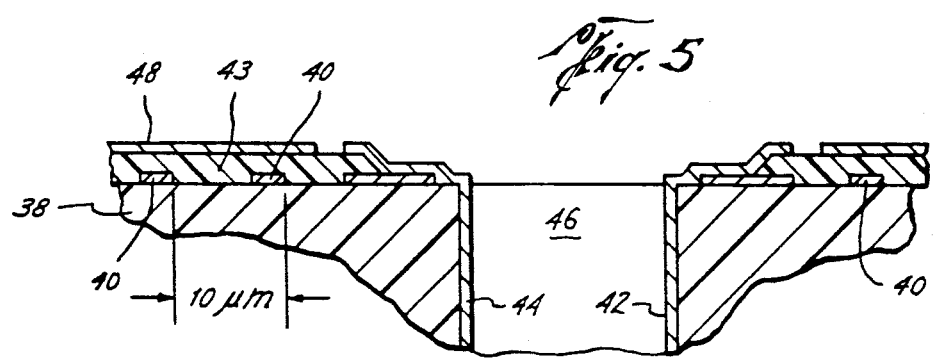
Fig. 5
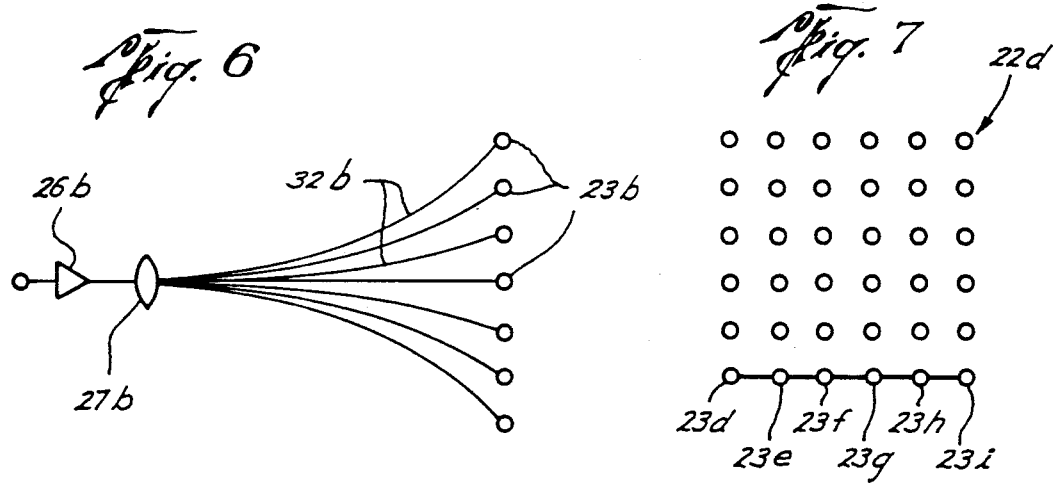
Fig. 6
Fig. 7

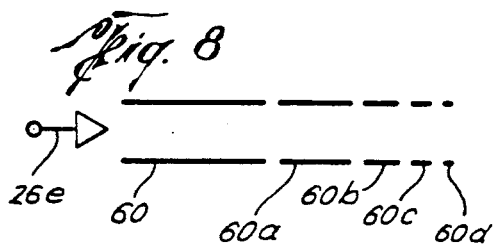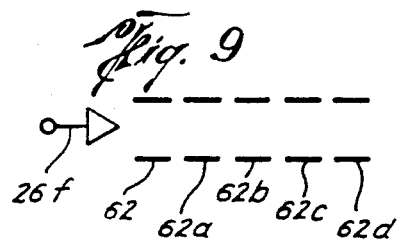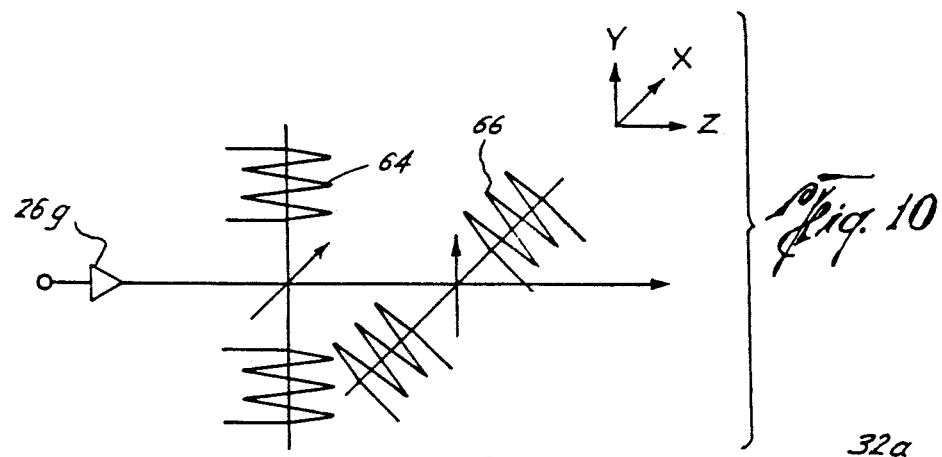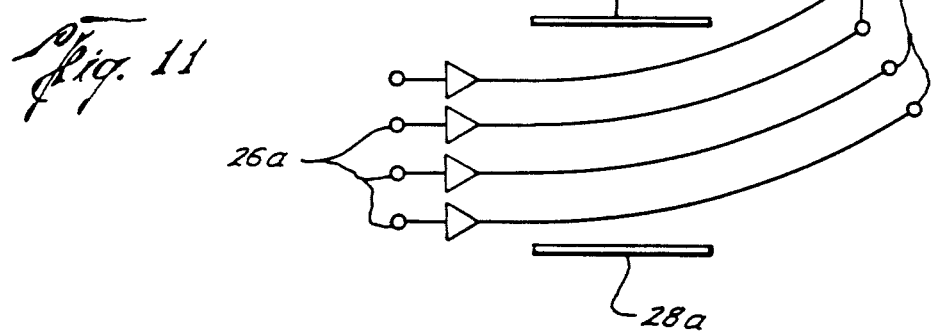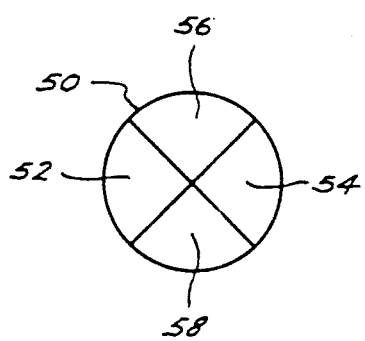

ELECTRICAL BEAM SWITCH

BACKGROUND OF THE INVENTION

Parallelism is widely seen as a key to enhancing computer performance in the future. Interconnection of the many processors or memory units is a major obstacle to achieving this result. Conventional crossbar switches are impractical because the number of switches required grows as the square of the inputs.

One of the features of the present invention is directed to an electron beam crossbar in which an array of electron emitters may be independently directed to communicate with any selected one or more of an array of receivers. The electron beam crossbar switch provides easily steerable beams, delivers the source power to the detectors with minimal stray current, and most importantly provides the ability to transmit data via beams of electrons through free space without using wires. The use of an array of electron beams to perform a crossbar switching function appears to be highly advantageous in solving the problem of a large number of processors, for example, as many as 1000.

However, the present invention is useful in other applications besides a crossbar switch such as an encoder/decoder in which data might be scrambled by a rapidly programmable permutation; and for various matrix operations, such as transposing rows and columns. Furthermore, the present invention is not limited to the use of electrons, but to other types of electric beams such as electrically charged particles such as protons and ions.

SUMMARY

The present invention is directed to an electrical beam switch for interconnection between a plurality of inputs and outputs and includes an array of electrically charged particles emitter source devices with an input connected to each of the devices. An array of detectors is positioned relative to the array of emitter devices for receiving charged particles from various of the emitter devices and x and y deflection means are positioned adjacent each of the emitters for directing the charged particles from each of the emitters to at least one of the detectors.

Still a further object of the present invention is the provision of a screen lens positioned adjacent the array of detectors for focusing and accelerating the directed charged particles onto a selected detector to provide more signal output and a reduction in deflection accuracy.

A further object is the provision of a shadow mask adjacent the front of the array of detectors for capturing stray particles and reducing background noise.

Still a further object is wherein the x and y deflection means may be electrostatic or magnetic deflection means.

Yet a further object is wherein the deflection means are a plurality of plates which are arranged to provide a digital to analog conversion of the deflection signals. This may be provided by five sets of plates in which the deflection voltage applied is different or by plates having different areas.

Yet a further object is the provision of x and y deflection means controlling the deflection of the charged particles from a plurality of emitters for providing enhanced functionality such as byte-wide and word-wide deflections for increasing the bandwidths.

Still a further object is to provide a broadcast capability by allowing a single emitter to actuate a plurality of deflectors. This may be accomplished by spreading the beam of emitted charged particles so as to be directed to a plurality of detectors or by interconnecting the detectors to be actuated by a single emitted beam.

A further object is to convert the received charged particles into light for providing an optical output for use in coupling to fibers which advantageously provides electrical isolation.

Still a further object is the provision of the use of deflection dithering and the provision of multiple axis differential receivers using deflection dithering to achieve multiplexing of more than one channel per receiver.

A further object is the provision of an electron beam crossbar switch for interconnection between processors or memory units and includes an array of electron emitter source devices having a data input connected to each of the electron emitters, and an array of detectors positioned relative to the array of electron emitter devices for receiving electrons from various of the emitter devices X and y electrostatic deflection plates are positioned adjacent each of the electron emitters for directing the electrons from each of the emitters to a selected one or more of the detectors.

Yet a still further object of the present invention is wherein the number of detectors per emitter is greater than unity for providing both data receiving and data control channels.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 4 is an enlarged fragmentary elevational view illustrating the structure of one set of deflection plates, FIG. 5 is an enlarged fragmentary elevational view of one set of deflector plates of FIG. 4, FIG. 6 is a schematic showing a method of obtaining a broadcast capability by using a beam spreader, FIG. 7 is a schematic of the receiver array interconnected to provide a broadcast capability, FIG. 8 is a schematic of deflection plates arranged in area to provide a digital to analog conversion of the deflection signal, FIG. 9 is a schematic of deflection plates arranged to provide a digital to analog conversion by being provided with different voltages, FIG. 10 is a schematic illustrating a magnetic x and y deflection means, FIG. 11 is a schematic of a plurality of emitters being directed by a single deflection means, and FIG. 12 is an electrical view of a multiple axis differential receiver.

DESCRIPTION OF THE PREFERRED EMBODIMENT

While the present invention will be described for purposes of illustration only, as an electron beam crossbar switch, it is to be understood that it may be used in other applications and may use various types of electrically charged particles.

Figure 1:
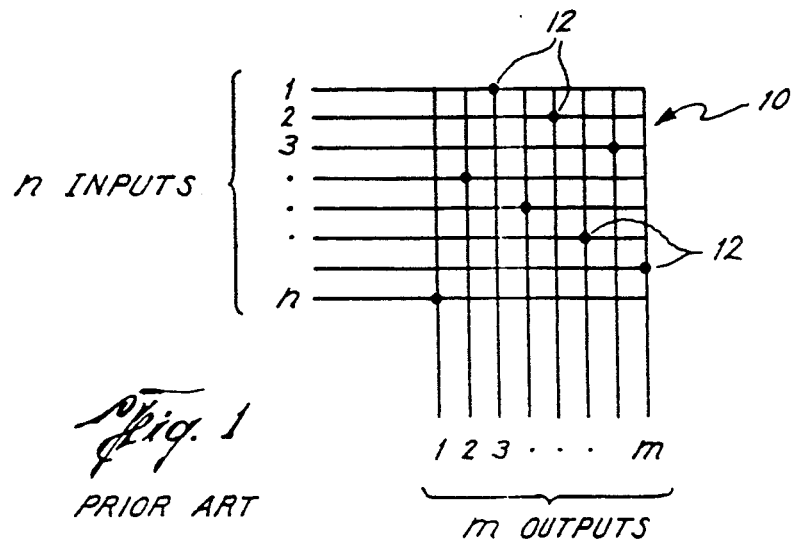
FIG. 1 is a schematic representation of a conventional switch type crossbar of the prior art.

Referring now to FIG. 1, a conventional crossbar system generally indicated by the reference numeral 10 is shown for the interconnection of processors or memory units for enhancing computer performance. The network 10 has n inputs and m outputs which are arranged so that any of the inputs can be selectively connected to any of the outputs. This requires a switch 12 at the intersection of each of the inputs and each of the outputs. The number of switches is n×m. Therefore, a hard wire system using electronic switches 12 is quite impractical when the number of inputs is large, such as 1000.

Figure 2:
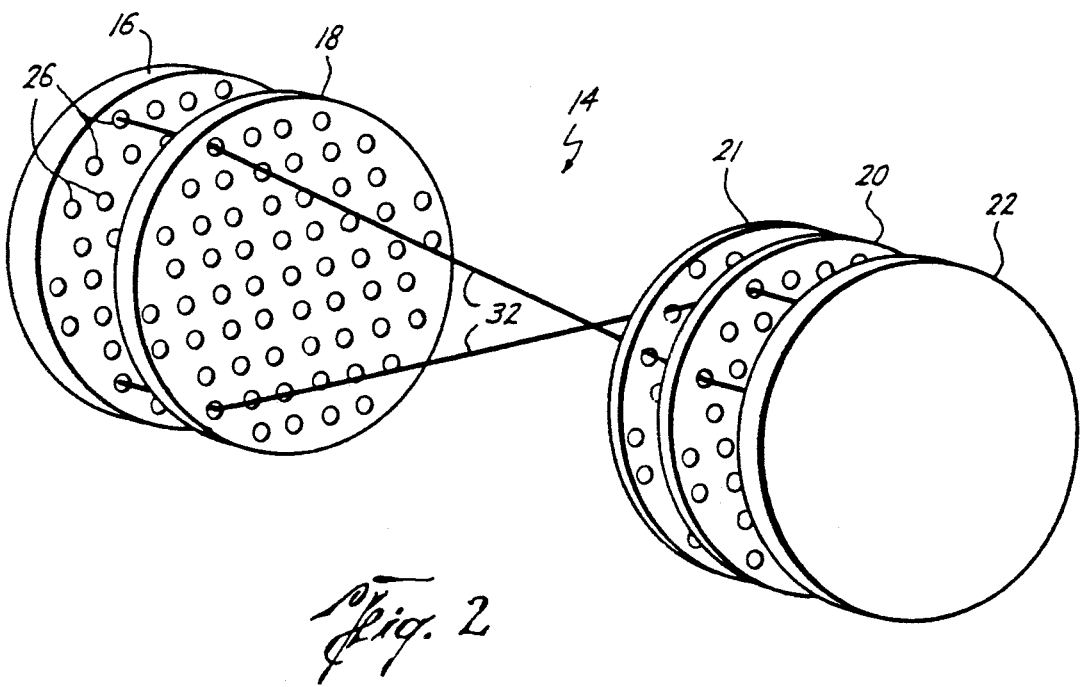
FIG. 2 is a schematic perspective elevational view of an electron beam crossbar switch utilizing the present invention.
Figure 3:
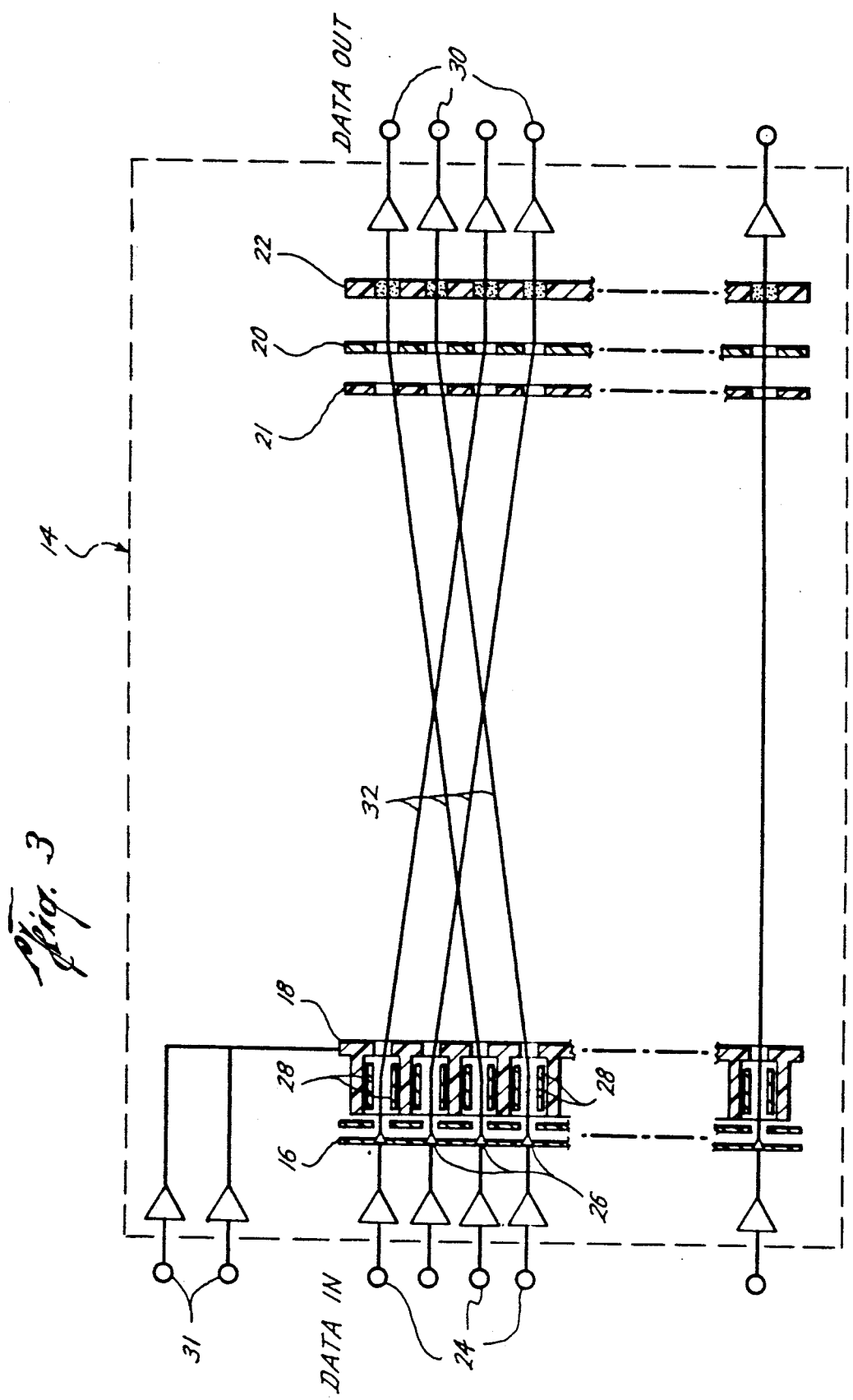
FIG. 3 is a schematic elevational view, in cross section, of the electron beam crossbar switch of FIG. 2.

Referring now to FIGS. 2 and 3, the electron beam crossbar switch of the present invention is generally indicated by the reference numeral 14 and generally includes a two dimensional array of electrical charged particle emitter source devices such as electron emitters 16, an array of x and y deflection means such as plates 18 for selectively directing the electrons from each of the emitters in the array 16, a screen lens array 20 for focusing and accelerating the directed electrons, and a two-dimensional array of detectors 22 positioned for receiving electrons from various of the emitters. A data input 24 is connected to each of the electron emitters 26 in the array 16. The x and y deflection plates in the deflection plate array 18 direct the electrons from each of the emitters 26 to a selected one of the detectors in the detector array 22 and the screen lens 20 focuses the directed electrons onto the selected detector 22. The screen 20 increases the signal output and reduces the deflection accuracy requirements.

If desired, a shadow mask 21 may be provided directly in front of the screen lens 20 for capturing stray electrons and may be useful in reducing background noise. Furthermore, it may be useful to direct the beam to be intercepted by the shadow mask 21 when a channel is inactive when the data is sent by dithering the beam (i.e., moving the beam back and forth across a detector).

The electron beam crossbar switch 14 of the present invention is shown schematically in FIG. 3 for receiving a plurality of data inputs 24, such as 1000, which can be provided by a 32×32 array, each of which is connected to one of the electron emitters 26. The emitter array 16 may be any conventional field emission electron array such as disclosed in U.S. Pat. No. 4,663,559 or any other type of charged particle emitter. The deflection plate means 18 may include a set of electrostatic deflection plates in both the x direction and y direction for each of the emitters 26 such as deflection plates 28 (only one set being shown in FIG. 3). The sets of x and y deflection plates may be in the same plane in a single array or may be in two side-by-side arrays. Deflection voltage is applied to the deflection plates and controlled by an address in circuit 30. Thus, each of the emitters 26 has the capability of addressing any of the detectors in the detector array 22 by adjusting the voltages on the x and y deflection plates. This addressing can be done very rapidly: if the address bits are sent bit serially at one Gbit/second rate, the deflection plates will have the correct voltages applied within a few ns after the last bit is sent.

The detector array 22 preferably uses wide bandwidth devices. For example, Gigahertz bandwidths can be provided using very low capacitance diode detectors operating in a fully depleted, reverse biased mode. Beam electrons entering the depletion region create electron hole pairs which are quickly swept out by the field across the junction. Current gains of several thousand reduces the beam current requirements and allows operation at lower beam energies. Alternate detectors, such as phosphors or scintillators, could be used to provide an optical output signal which would be useful for coupling to fibers and would have the advantage of increasing the electrical isolation.

For large arrays, and high bandwidths as proposed, the required deflection accuracy of the electron beams could become a problem. Thus, the screen lens 20 may be added to focus the electron beams onto the selected receiver diode detector. The field protruding through the field lens 20 aperture attracts the electrons in and accelerates the electron beams thereby increasing energy on the detector and the resultant signal to the outputs 30 from the detector array 22.

The time of flight (TOF) of the electron beams 32 is important as it will be a major time component in the total time (latency) to establish a data channel. For example, an electron with an energy of 300 eV travels 1 cm in 1 nano second. Therefore, if the electron emitter array 16 is spaced from the detector array 22 a distance of 10 cm, the TOF will be only 10 nanoseconds when the accelerating voltage is 300 volts.

The electromagnetic interaction between the electron beams 32 may be significant. Therefore, it is desirable to operate at the lowest possible beam current levels. The minimum beam current will be set by the sensitivity of the detectors in the array 22. In the best case, the noise would be simply shot (statistical) noise in the number of electrons per bit. A shot noise level of, for example, 10% would require an average of 100 electrons to be detected. If the detection time per bit is 1 ns the current must be 16 nA, which should be a low enough beam current level for satisfactory operation.

In the above-named discussion, it was assumed that each of the data input channels 24 corresponds to a separate entity, either processor or memory, and that the word or data to be transmitted is done bit serially. Another way to handle the input is to dedicate, for example, sixteen of the input channels 24 for each processor and transmit the word or data sixteen bits at a time, and cut down the total time to transmit the word. This could be useful for systems having fewer but faster processors.

Referring now to FIG. 11, the use of a single set of deflection plates 28a is shown which direct a plurality of beams 32a from a plurality of emitters 26a, together with individual deflection plates (not shown) provide enhanced functionality such as byte-wide and word-wide deflections.

If the GHz band width desired is unachievable or insufficient, greater effective bandwidths can be obtained by using a multiplicity of sources per channel and using beam intensity modulation. For example, a 4×4 source array, with a single set of x-y deflection plates, would provide sixteen times the bandwidth. That is, referring to FIG. 11, a set of deflection plates 28a (only the y set being shown) may be used for a plurality of emitters 26a for steering the group of beams 32a. This is useful for achieving high bandwidths or for achieving the same total bandwidth using a lower bandwidth per beam.

Data can be sent either by modulating the electron beam intensity or the deflection voltages at similar Gbit/sec. speeds. In the former case, application of voltage signals levels of approximately 1 volt can be used to modulate the intensity of the beam. In the latter case the beam intensity is constant, but the beam direction is modulated so as to be directed to either the TRUE or COMPLEMENT portion of a differential receiver. Referring to FIG. 12, a differential receiver 50 is shown having an x and y axis differential receiver. That is, a signal can be dithered in the x direction between the TRUE portion 52 and the COMPLEMENT portion 54 and/or in the Y direction between the TRUE portion 56 and the COMPLEMENT portion 58. The use of a differential receiver 50 allows the use of multiple axis dithering to achieve multiplexing of more than one channel per detector.

In some applications it may be desirable for the apparatus 10 to have a broadcast capability. That is, it may be desired for a single emitter to be received by a plurality of detectors. In one embodiment, as best seen in FIG. 6, broadcast capability can be provided by the use of beam spreading optics, together with switched emitter brightness. Switching the emitter brightness could be achieved either by amplifying the beam modulation signal or adding a dc offset to that signal. Thus an emitter 26b may have its beam 32b spread over a plurality of detectors 23b by a beam spreader 27b such as astigmatic lenses including quadruple lenses and higher order elements.

An alternate method for achieving broadcast capability would be to use one or more detectors which would receive the signal, amplify it, and transmit it to other predetermined detectors. Referring now to FIG. 7, the detector array 22d has a plurality of detectors. One of the detectors such as 23d could receive a signal and could be interconnected to any number of other detectors such as detectors 23e, 23f, 23g, 23h and 23i and therefore transmit and broadcast the received signal at detector 23d to the other connected detectors.

If desired, one or more receiving channels could be used, not for normal data receiving, but to provide means for calibrating the apparatus 10, either periodically or continuously, and either globally or individually on a per channel basis. For example, these special channels could be used in a feedback loop to compensate for long term drift in the current or deflection accuracy.

While discrete digital to analog converters (DAC) may be used connected to the x and y deflection plates, the use of special multiple plates could be provided to eliminate DAC chips. Each set of plates would provide a fixed deflection in response to a "1" and second fixed deflection in response to a "0". The deflections would differ by a factor of two for each bit of the address. This can be achieved by using five sets of plates to replace a single set of plates and by providing different length plates or by providing different reference voltages on each set of plates. Referring now to FIG. 8, an emitter 26e has five sets of y deflection plates 60, 60a, 60b, 60c and 60d. The length of the plates would vary by a factor of two. Thus plates 60a are one-half the length of plates 60 and twice the length of plates 60b, etc. Similar x deflection plates could be provided. Referring now to FIG. 9, emitter 26f has its emission directed by five sets of equal length plates 62, 62a, 62b, 62c and 62d. In this embodiment the deflection voltage applied to the sets of plates is varied by a factor of two.

As previously mentioned, x and y deflection means may be magnetic deflection as well as electrostatic deflection or a combination. Referring to FIG. 10, an emitter 26g has its emission directed in the x direction by a set of electromagnetic coils 64 and in the y direction by a set of electromagnetic coils 66.

In comparison with an optical type crossbar switch which has been proposed in the literature, the charged particle beam approach allows easily steerable beams and delivers the source power to the detectors with minimal stray current. The use of steerable beams implies that the size of an n×m crossbar scales linerarly with n, whereas an optical or conventional crossbar scales quadratically with n. The electrical beam approach uses the features which the optical approach claims to be important, that is, the ability to send beams of electrically charged particles through free space without using wires. Even though the charged particles in the current apparatus do interact, these effects can be minimized by careful design to achieve useful performance.

Of course, the crossbar 14, is unidirectional. A second crossbar 14 may be required to provide two-way communication between the senders and receivers. For example, this might be required if the senders are all associated with processors and the receivers are all associated with memories. Alternately, if the crossbar is used for inter-processor communications, a second crossbar would not be required.

A problem will arise, which we will term "conflicts", if more than one source is attempting to send data to a single detector. One method to avoid this is to ensure that no such conflicts occur. Depending on the application, however, this may not be practical. The preferred method is to provide a second channel for each receiver. This would double the number of detectors in the detector array 22. One channel would be an "open access" channel, and would be used for short messages and for logging requests to use the second channel. The detector for this channel must be capable of distinguishing a valid message and an invalid message caused by more than one beam sending at the same time. This multiple beam detection could be achieved either by analog or digital means; i.e., by monitoring the amplitude of the signal or by using redudant bits in the message to check for data consistency. If the message is valid, an acknowledgement would be sent to the sender verifying that the message had been received. (This assumes that the sender's identity will be sent as part of the message.) If the sender does not receive an acknowledgement, he would have to re-transmit at a later time. The second channel, which we call the "restricted access" channel, would be reserved so that no data could be transmitted to this channel unless permission was first received after sending a request over the "open access" channel. The "restricted access" channel would be especially useful for long messages, which otherwise would have a vanishingly small probability of successful transmission without conflicts. The use of these two channels would also be useful to allow for short messages to be successfully sent without having to wait for the completion of a long message.

It is important to miniaturize the electron beam crossbar 14 of the present invention so as to reduce the deflection voltages required and to reduce the time of flight contribution to the latency of the crossbar. Electron beam emitters 16 with separations as small as a few microns have been developed. However, there is a need to fabricate miniature deflection plate arrays 18 and to provide wires to the deflection plates to set the voltages. One method, as best seen in FIGS. 4 and 5, would be to use micro-machining techniques to etch holes 46 in a substrate material 38, for example, silicon. For example, the hole dimensions could be 100×200 microns and the substrate could be approximately 500 $\mu$m (20 mils) thick and provide deflection angles of up to plus or minus 0.10 radians. The holes could be spaced at 300 $\mu$m centers, so that a 32×32 array could fit into an area of 0.96 cm$^2$. Layers of metalization can be provided for strip lines 40 to the deflection plates 42 and 44 and minimize capacitive coupling between lines. The deflection plates 42 and 44 are formed by metalizing the two long opposite sides of the hole 46, being careful to ensure that there is no metal on the two short sides which could short out the plates or distort the electric fields. This can be achieved by using a directional etch or a directional deposition technique.

Only a single layer of wires should be necessary to bring all of the voltages to the plates 42 and 44. For 1000 plates, 2000 wires would be required. Using the full 4 cm perimeter of the array would correspond to a wiring pitch of 20 $\mu$m. The average line pitch after subtracting the area lost to the holes 46 would be 10 microns which is a reasonable value for fabrication. For example, the wires 40 would be 4 $\mu$m wires with 6 $\mu$m spaces and the distance between the wires 40 and a ground plate 48 could be 1 micron. As previously indicated two such sets of plates, one for the x deflection and the other for the y deflection, may be provided. While it may be possible to do both in a single substrate 38, it would be more difficult to fabricate and would require a greater wiring density but nevertheless is another possibility.

As best seen in FIG. 5, the metalization of the plates 42 and 44 may be done with the reference plane layer 48. That is, in step 1 the lines 40 are deposited and formed by patterning and covered with an insulation layer 43 in step 2. Step 3 involves making the holes 46 through the substrate 38. Step 4 includes metalization of the plates 42 and 44 as well as the reference layer 48. Step 5 includes removing metal from the sides of the holes 46 other than plates 42 and 44. If step 4 formed the plates 42 and 44 without metalizing the other sides then step 5 may be omitted.

The present invention, therefore, is well adapted to carry out the objects and attain the ends and advantages mentioned as well as others inherent therein. While a presently preferred embodiment of the invention has been given for the purpose of disclosure, numerous changes in the details of construction, and arrangement of parts, will be readily apparent to those skilled in the art and which are encompassed within the spirit of the invention and the scope of the appended claims.

What is claimed is:

1. An electron beam crossbar switch for interconnection between processors or memory units comprising,
   a two dimensional array of electron emitter source device,
   a separate data input connected to each of the electron emitters,
   a two dimensional array of independent and unrelated data output detectors positioned relative to the array of electron emitter devices for receiving electrons from any of the emitter devices,
   x and y deflection means positioned adjacent each of the electron emitters for individually directing the electrons from each of the emitters to a selected one of any of the detectors, and
   separate address means connected to each of the deflection means for individually directing the data input to each emitter to a different selected detector.

2. The apparatus of claim 1 including,
   a screen lens positioned adjacent the array of detectors for focusing and accelerating the directed charged particles onto the selected detector.

3. The apparatus of claim 1 including,
   a shadow mask adjacent the front of the array of detectors.

4. The apparatus of claim 1 wherein at least some of the x and y deflection means direct the charged particles from a plurality of emitters.

5. The apparatus of claim 1 wherein the x and y deflection means are electrostatic plates and include a plurality of both x and y deflection plates arranged to provide a digital to analog conversion of the deflection signals.

6. The apparatus of claim 5 wherein five sets of deflection plates are provided in which each set has a different sized area.

7. The apparatus of claim 1 including,
   means for actuating a plurality of detectors from a single charged particle emitter.

8. The apparatus of claim 7 wherein said means for actuating a plurality of detectors includes,
   means interconnecting a plurality of detectors.

9. The apparatus of claim 1 wherein some of the detectors include means for converting the energy received from the charged particles into light.

10. The apparatus of claim 1 wherein at least some of the detectors are differential detectors and the deflection means including means for dithering the emitted charged particles.

11. The apparatus of claim 1 wherein the detectors are differential detectors along more than one axis.

12. The apparatus of claim 1 wherein the number of detectors per emitter is greater than unity for providing data receiving and data control channels.

* * * * *